(12) United States Patent
Kim et al.

(10) Patent No.: US 7,074,635 B2
(45) Date of Patent: Jul. 11, 2006

(54) MEMS STRUCTURE AND METHOD FOR FABRICATING THE SAME

(75) Inventors: Jong Sam Kim, Kyungki-do (KR); Sung Jun Lee, Seoul (KR); Ro Woon Lee, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 22 days.

(21) Appl. No.: 10/927,459

(22) Filed: Aug. 27, 2004

(65) Prior Publication Data

US 2005/0280106 A1    Dec. 22, 2005

(30) Foreign Application Priority Data

Jun. 21, 2004    (KR) ...................... 10-2004-0046014

(51) Int. Cl.
*H01L 21/00*    (2006.01)

(52) U.S. Cl. .......................................... 438/50; 438/52

(58) Field of Classification Search ..................... None
See application file for complete search history.

(56) References Cited

U.S. PATENT DOCUMENTS

2004/0072386 A1*  4/2004  Tanabe et al. ................ 438/68

* cited by examiner

*Primary Examiner*—Wai-Sing Louie
(74) *Attorney, Agent, or Firm*—Lowe Hauptman & Berner, LLP.

(57) ABSTRACT

A MEMS structure includes a floating space formed on the upper silicon layer by a first dry etching, and then dry etched to a predeterminded depth on the lower silicon layer by etching gas supplied through the etched holes from which the oxide film has been removed at the bottom surface thereof in a second dry etching process, so as to float the movable portion; and the oxide film for preventing electrical short circuit remaining on the lower surface of the movable portion so as to correspond to the lower silicon layer leaving the floating space therebetween.

6 Claims, 7 Drawing Sheets

Solution

Solution

MEMS STRUCTURE AND METHOD FOR FABRICATING THE SAME

RELATED APPLICATIONS

The present application is based on, and claims priority from, Korean Application Serial Number 2004-46014, filed Jun. 21, 2004, the disclosure of which is hereby incorporated by reference herein in its entirety.

BACKGROUND OF THE INVENTION

1. Field of the Invention

The present invention relates to a MEMS structure and a method for fabricating the same, and more particularly to a MEMS structure in which a floating space for allowing a movable portion to move is formed by a dry etching process, and thus is capable of fundamentally preventing a stiction phenomenon which occurs when drying an etchant or other liquid, securing electrical properties and stability thereof, and preemptively preventing electrical short circuit due to stiction; and a method for fabricating the same.

2. Description of the Related Art

Recently, a number of products employing Micro-Electro Mechanical Systems (MEMS) technology which is advantageous for miniaturization and high accuracy has been developed. To this MEMS technology are applied various techniques for fabricating a MEMS structure having a stationary portion fixed in a position by a variety of methods, and a movable portion moving relative to the stationary portion.

As examples of apparatuses having such a MEMS structure, there may be mentioned accelerometers, pressure sensors, flow sensors, transducers, microactuators and the like, manufactured by MEMS manufacturing techniques including photolithography, thin film vapor deposition, bulk micromachining, surface micromachining and etching.

Meanwhile, in order to allow the movable portion constituting a part of the MEMS structure to be moved, it is necessary to release a movable portion from a substrate. As these release techniques and methods, producing a cavity on a wafer substrate (referred to as "bulk micromachining"), removing a sacrificial layer formed on the middle part of the wafer substrate (referred to as "surface micromachining"), and the like, are known.

A widely used method for fabricating the MEMS structure involves wet etching the sacrificial layer to remove and release it. The method of fabricating may be described as follows.

That is, as shown in FIG. 1a, a Silicon on Insulator (SOI) wafer substrate 10 is fabricated by disposing a sacrificial layer, i.e., an oxide film 12 made of $SiO_2$ between upper and lower silicon layers 11 and 13. Then, as shown in FIG. 1b, predetermined patterns are formed by printing a photoresist mask 14 on the upper surface of the wafer substrate 10 using photolithography.

Next, as shown in FIG. 1c, by dry etching, in the vertical direction from the upper surface to the lower surface, the wafer substrate 10 on which the patterns were not formed due to the photoresist mask 14, to form a plurality of etched holes 16. The depth of the etched holes 16 thus formed is controlled by stopping the etching process at the oxide film 12 which is a sacrificial layer.

Next, the photoresist mask 14 of an organic material remaining on the upper surface of the wafer substrate 10 having a plurality of the etched holes 16 formed thereon, as shown in FIG. 1d, is removed by an ashing process. A wet etchant such as HF, dilute HF (DHF), buffer oxide etchant (BOE), or the like is applied to the etched holes 16 on the wafer substrate 10 from which the photoresist mask 14 had been removed.

In this case, when the oxide film 12, which is a sacrificial layer formed between the upper and lower silicon layers 11 and 13 by wet etching using the etchant, is removed to form a floating space R corresponding to the height by which the sacrificial layer had been removed, as shown in FIG. 1e, there is fabricated a MEMS structure 1 having a stationary portion 1a in which the upper and lower silicon layers 11 and 13 are interconnected because the oxide film 12 has not been removed by the etchant, and a movable portion 1b floated on the floating space R from which the oxide film 12, which is a sacrificial layer, has been removed.

As can be seen from FIG. 2, the movable portion 1b movable relative to the stationary portion 1a horizontally extends from the stationary portion 1a and may take a beam or plate-like shape having upper and lower surfaces. An electrode portion 19 is formed on the upper surface of the stationary portion 1a.

However, in order to remove the oxide film 12 in the process for preparing the MEMS structure 1 by using such a conventional method as described above, it is usually required to use the etchant. Further, there is employed a rinse solution in a rinse process which performs washing of the wafer substrate 10. Therefore, there may remain solutions such as etchant and rinse solution in the floating space R from which the sacrificial layer oxide film 12 has been removed.

Consequently, the solutions remaining in the floating space R exert surface tension on the movable portion 1b floated in the floating space R upon drying and removing them as show in FIG. 2, thereby a floating portion 20 of the movable portion 1b subsides downwardly and then the lower surface thereof adheres to the lower silicon layer 13 or other structures adjacent thereto. This is called "stiction" which interferes with driving of the MEMS structure 1, thus greatly deteriorating characteristics of the products.

Such a stiction phenomenon in the MEMS structure 1 lowers sensitivity of the sensor of interest. Further, where it is severe, there is difficulty in manufacturing the device, presenting a factor of decreasing yield of the micromachining process.

Recently, a variety of techniques for preventing the stiction phenomenon from occurring in the MEMS structure have been developed. One method is to minimize the contact area between the floating portion 20 of the movable portion 1b and the lower silicon layer 13. Another method is to solidify the solution that is a main factor of the surface tension between the floating portion 20 of the movable portion 1b and the wafer substrate, followed by sublimation.

However, the conventional methods to prevent the stiction phenomenon from occurring in the MEMS structure 1 have disadvantages such as decreased yield, additional steps in a manufacturing process and expensive equipment.

Further, under the condition in which opposite electrical polarities are applied to the movable portion 1b and the lower silicon layer 13, when the floating portion 20 of the vertically deforming movable portion 1b is in contact with the wafer substrate, electrical short circuit is induced thus causing product defects leading to disabling function of the sensor.

Additionally, the height of the floating space R thus formed is restricted by the thickness of the oxide film 12 made of an expensive material. Thus, if it is desired to elevate the height of the floating space R, so as to increase the range of motion of the movable portion 1b, there is a defect of increased costs in manufacturing the MEMS structure 1.

SUMMARY OF THE INVENTION

Therefore, the present invention has been made in view of the above problems, and it is an object of the present invention to provide a MEMS structure which is capable of preventing electrical short circuit even when the wafer substrate and the movable portion are in unavoidable contact, to which opposite electrical polarities are applied, of increasing production yield thereof, and of manufacturing at lower production costs.

It is another object of the present invention to provide a method for fabricating a MEMS structure which is capable of fundamentally preventing the stiction phenomenon which occurs when drying the solution, ensuring the stable floatation of the movable portion to improve sensor sensitivity, and increasing the production yield thereof by forming the floating space using only dry etching, not depending on wet etching.

In accordance with the present invention, the above and other objects can be accomplished by the provision of a MEMS structure having a wafer substrate with an oxide film disposed between the upper and lower silicon layers thereof, a stationary portion integrally connected to the wafer substrate and a movable portion movably suspended relative to the stationary portion, comprising:

a floating space formed on the upper silicon layer by a first dry etching, and then dry etched to a predetermined depth on the lower silicon layer by etching gas supplied through the etched holes from which the oxide film has been removed at the bottom surface thereof in a second dry etching process, so as to float the movable portion; and the oxide film for preventing electrical short circuit remaining on the lower surface of the movable portion so as to correspond to the lower silicon layer leaving the floating space therebetween.

Preferably, the etching gas for removing the externally exposed oxide film through the etched holes is CxFy-based gas.

Preferably, the floating space is isotropically etched to a minimum depth on the lower silicon layer so as to control a minimum amount of upward and downward displacement in which the movable portion moves upwardly and downwardly.

Preferably, the oxide film is formed to a thickness of 500 Å to 2.0 μm so as to electrically insulate the space between the upper and lower silicon layers, to which opposite electrical polarities are applied.

Further, the present invention provides a method for fabricating a MEMS structure having a movable portion movable relative to a stationary portion, comprising the steps of:

providing a wafer substrate having an oxide film disposed between upper and lower silicon layers thereof;

patterning a photoresist mask on the upper surface of the wafer substrate;

first dry etching the wafer substrate by using a first dry etching gas to expose the oxide film so as to form a plurality of etched holes on the upper silicon layer;

removing the oxide film externally exposed at the bottom surface of the etched holes by a second dry etching using a second dry etching gas while vapor depositing polymer protective layers on the inner circumferences of the etched holes;

forming a floating space in which floatable movement of the movable portion is permitted, by third dry etching the lower silicon layer exposed thorough the bottom surface of the etched holes from which the oxide film was removed, using a third dry etching gas; and removing the photoresist mask remaining on the upper surface of the wafer substrate and the polymer protective layers vapor deposited on the etched holes.

Preferably, the second dry etching step of removing the oxide film externally exposed through the etched holes is performed by reaction of the second etching gas and oxide film in a reaction chamber to which the CxFy-based second etching gas is supplied.

Preferably, in the step of forming the protective layers by vapor depositing the polymer on the inner walls of the etched holes, the polymer is not vapor deposited on the bottom surface of the etched holes due to ion bombardment of ions impinging on the bottom surface of the etched holes and thus the lower silicon layer is externally exposed.

More preferably, the ion bombardment is performed by selectively applying cathode or anode voltage to the wafer substrate in the reaction chamber such that cations or anions in the reaction chamber are physically impinged on the bottom surface of the etched holes.

Preferably, the third dry etching step of removing the lower silicon layer through the etched holes is performed by reaction of the third etching gas and the lower silicon layer in the reaction chamber to which the third etching gas such as $XeF_2$, $SF_6$, or $CF_4$ is supplied.

Preferably, the first dry etching for dry etching the etched holes, the second dry etching for removing the oxide film and the third dry etching for dry etching the lower silicon layer are performed in the same reaction chamber.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Preferred embodiments of the present invention will now be described in detail with reference to the annexed drawings. FIGS. 3a through 3f illustrate the steps for fabricating a MEMS structure in accordance with the present invention. FIG. 4 shows a cross-sectional view of a MEMS structure in accordance with the present invention.

Referring to FIGS. 3 and 4, a MEMS structure 100 of the present invention includes a stationary portion 100a integrally formed on a wafer substrate 110, and a movable portion 100b movably formed relative to the stationary portion 100a. The MEMS structure in accordance with the present invention may fundamentally prevent a stiction phenomenon occurring during the drying process of the etchant used in the wet etching process by forming the movable portion 100b and a floating space R for floating the movable portion 100b by the dry etching process.

Figure 1A:
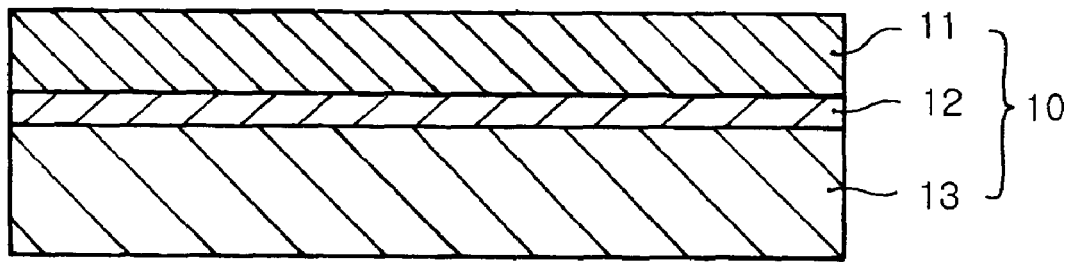
FIGS. 1a through 1e illustrate the steps for fabricating a conventional MEMS structure.
Figure 1B:
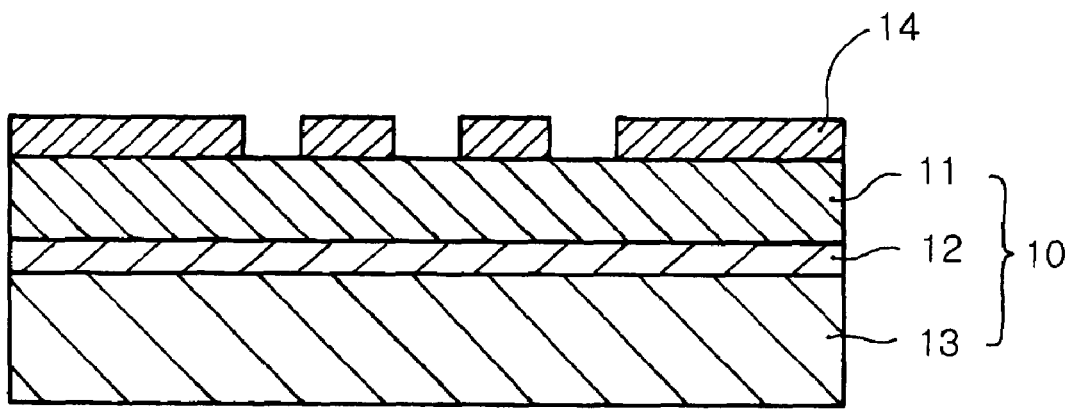
Figure 1C:
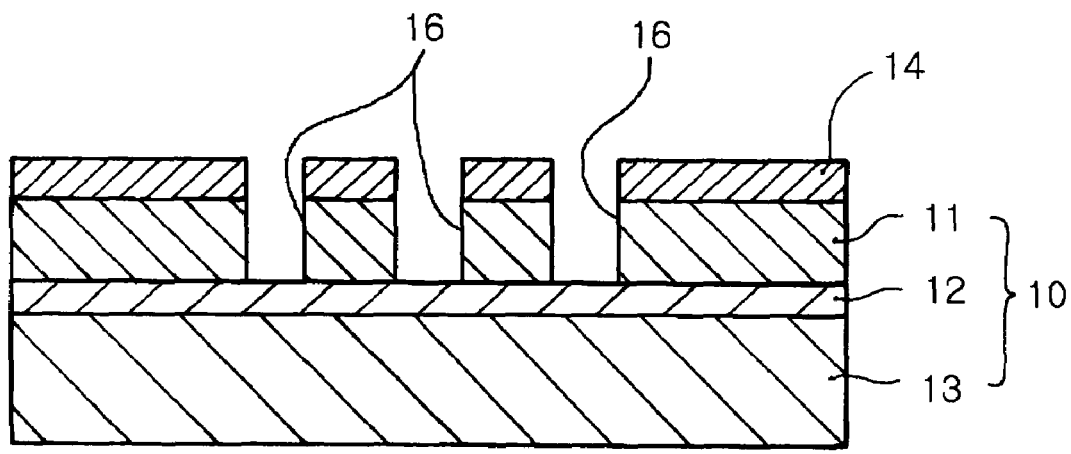
Figure 1D:
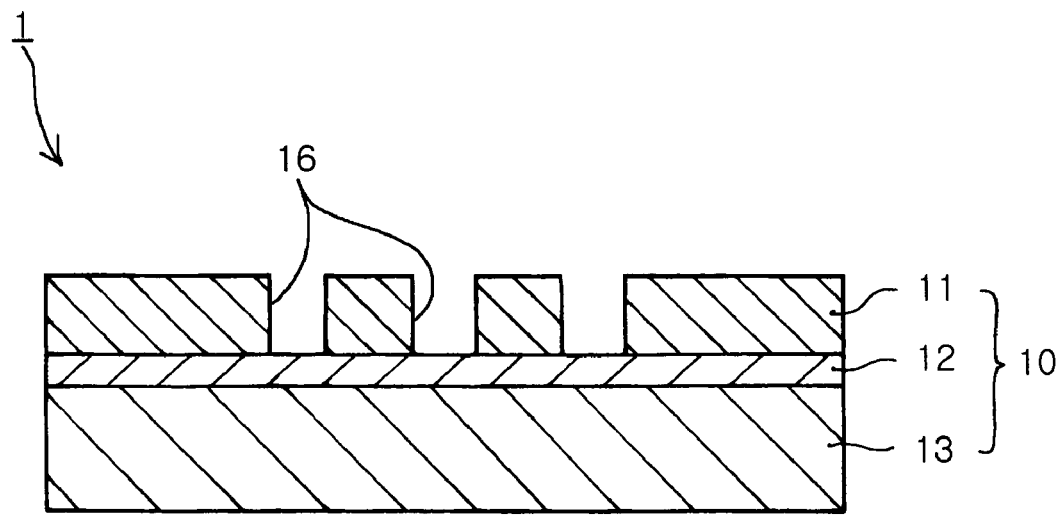
Figure 1E:
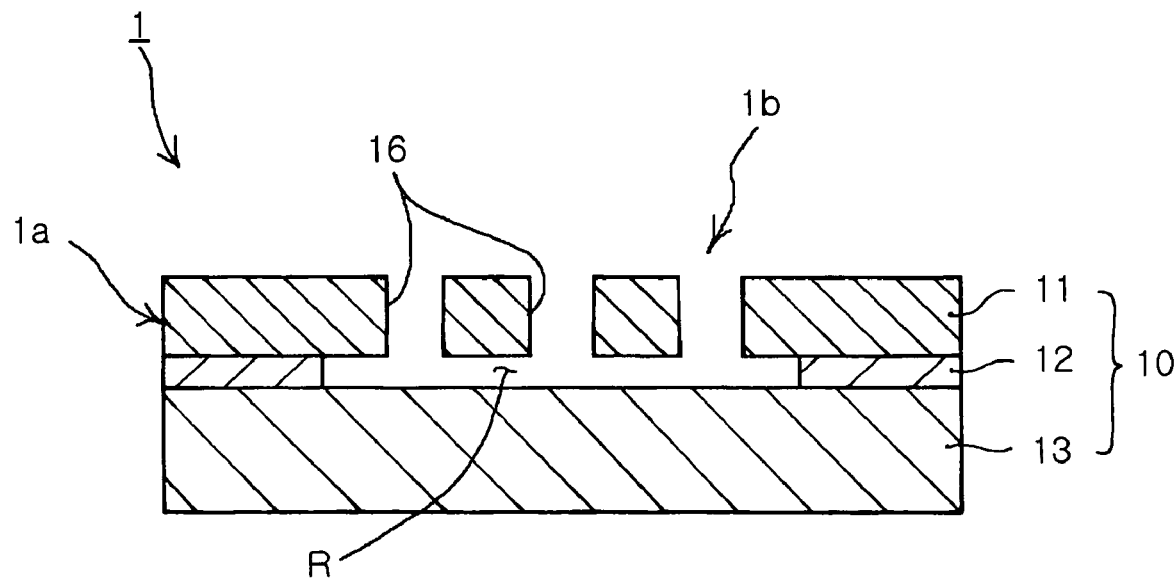
Figure 2:
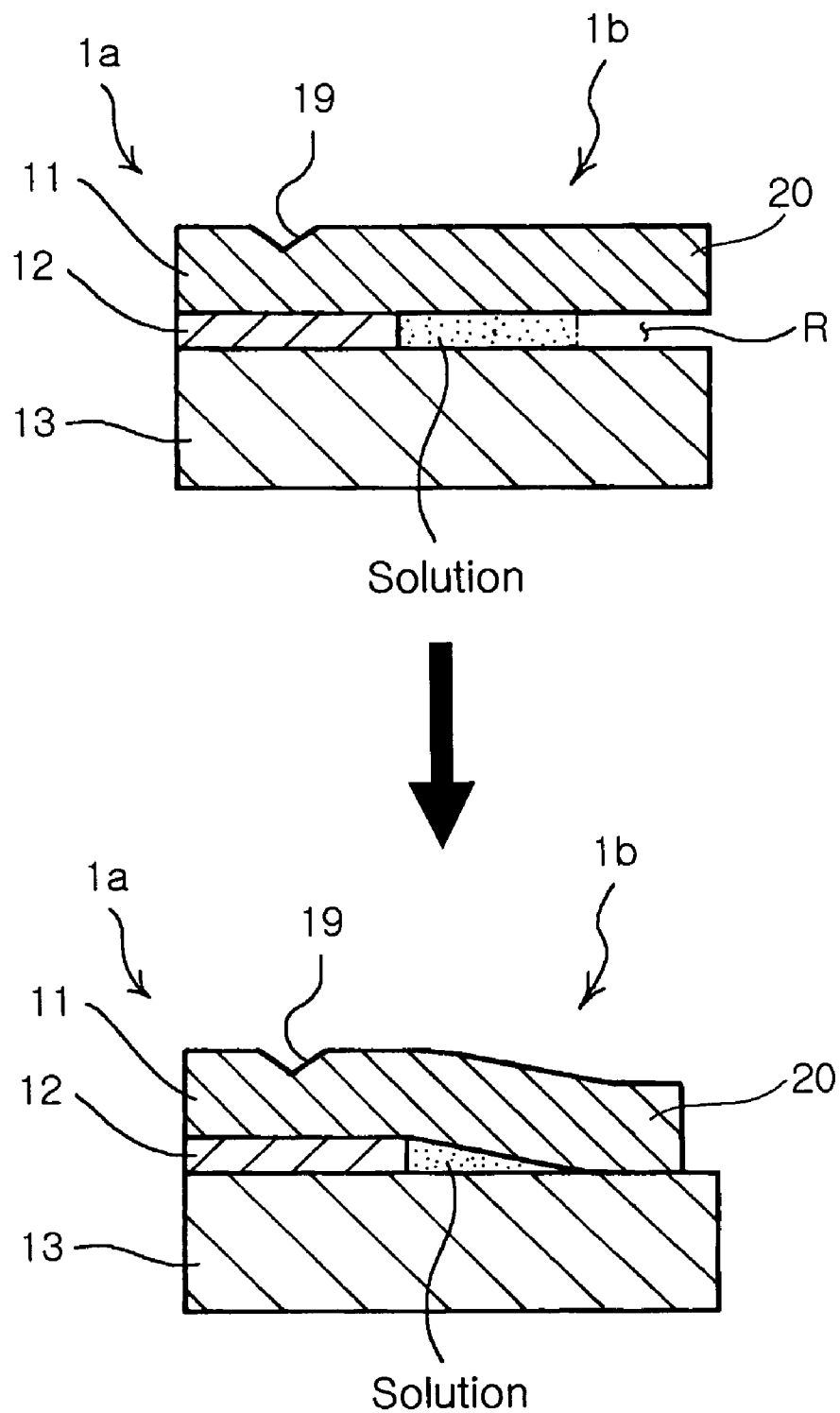
FIG. 2 is a cross-sectional view of a conventional MEMS structure.
Figure 3A:
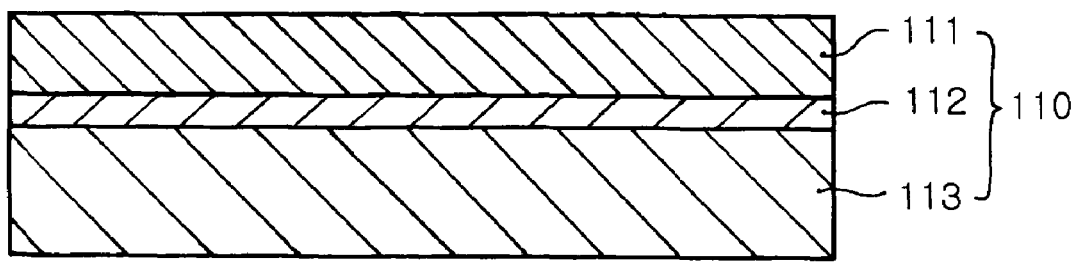
FIGS. 3a through 3f illustrate the steps for fabricating a MEMS structure in accordance with the present invention.
Figure 4:
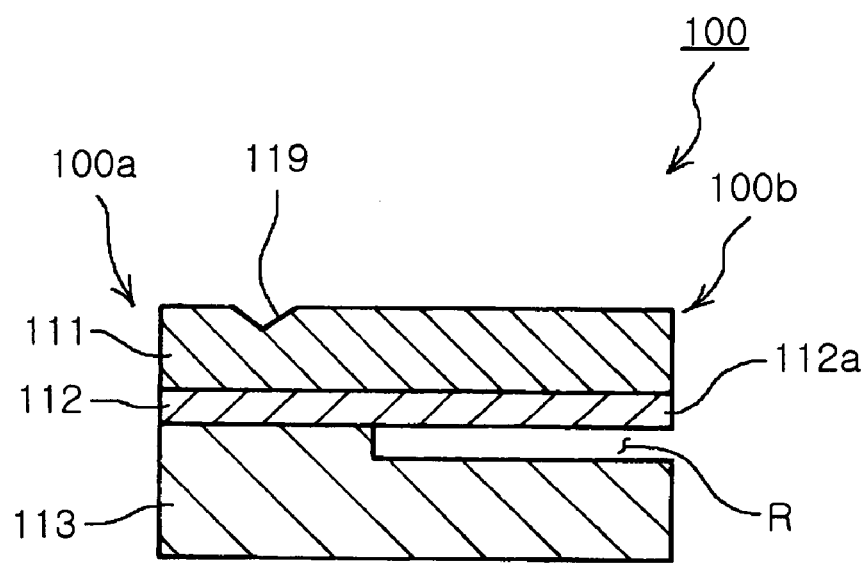
FIG. 4 is a cross-sectional view of a MEMS structure in accordance with the present invention.

As shown in FIG. 3a, there is provided the wafer substrate 110 in which a predetermined thickness of an oxide film 112 is uniformly vapor deposited and laminated on the entire upper surface of the lower silicon layer 113, and a predetermined thickness of the upper silicon layer 111 is continuously vapor deposited and laminated on the upper surface of the oxide film 112.

This wafer substrate 110 is a Silicon On Insulator substrate in which a thin film insulating layer was embedded between the upper silicon layer 111 which is an upper substrate and the lower silicon layer 113 which is a lower substrate, forming an electrical circuit, thus forming a lamination structure having a silicon single crystals layer on the oxide film 112 which is an insulating layer, thereby decreasing parasitic capacitance.

Figure 3B:
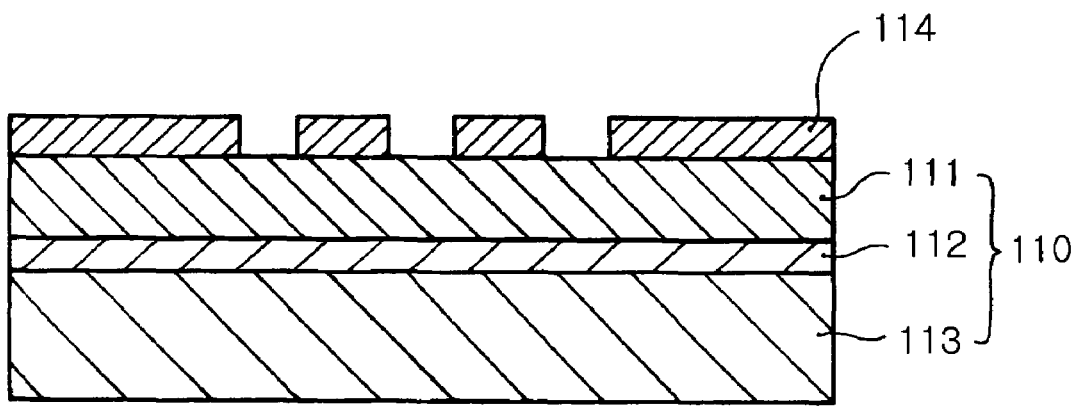

Then, as shown in FIG. 3b, in order to print patterns for forming a plurality of etched holes 116, a photoresist mask 114 is patterned on the upper surface of the wafer substrate 110 by photolithography as it is previously designed.

Figure 5:
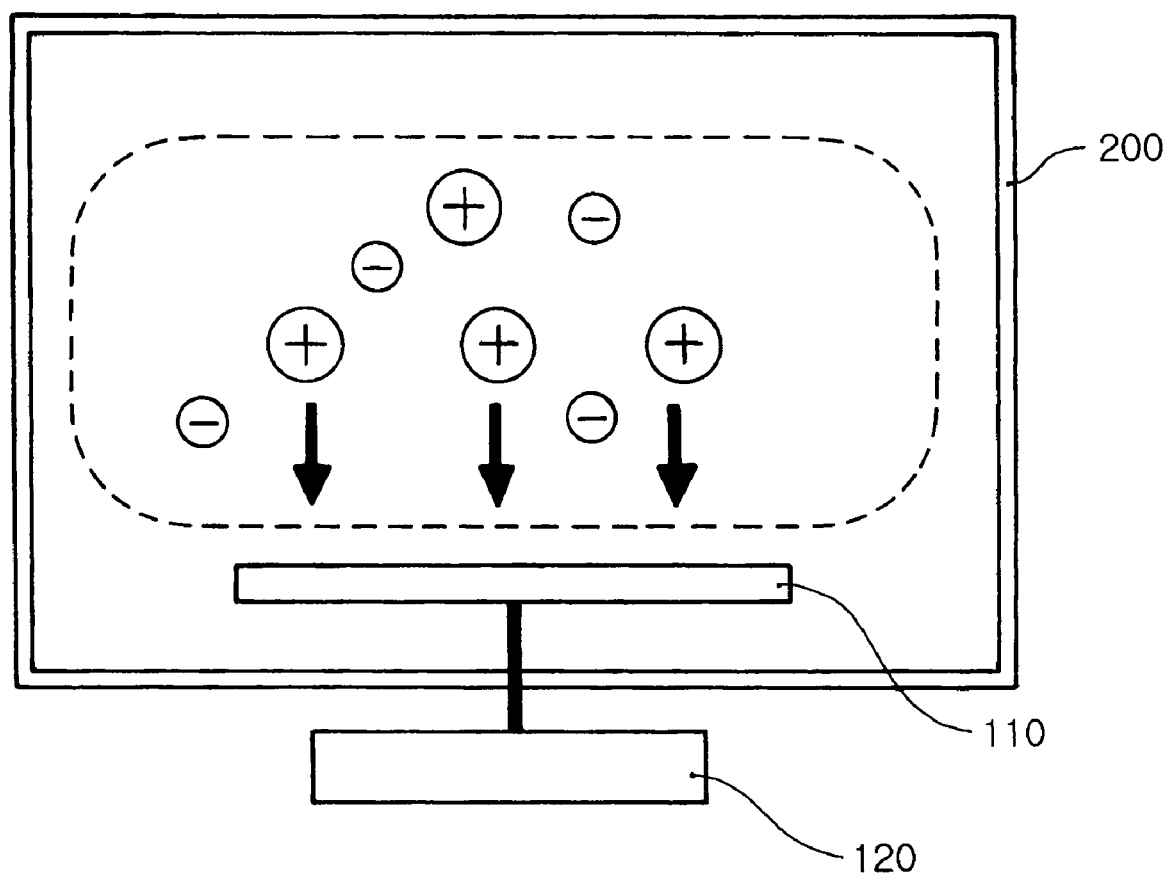
FIG. 5 shows a scheme in which ion bombardment is effected in a reaction chamber during a process for fabricating a MEMS structure in accordance with the present invention.

As shown in FIG. 5, the wafer substrate 110 having the photoresist mask 114 printed on the upper surface thereof was charged to an inner space of a reaction chamber 200 having an inlet and outlet for supplying and discharging etching gas, respectively (not shown). The inside of the reaction chamber 200 is subjected to plasma conditions and then the wafer substrate 110 is dry etched using the first etching gas, such as mixed chemical gas or argon gas, supplied through the gas inlet.

Figure 3C:
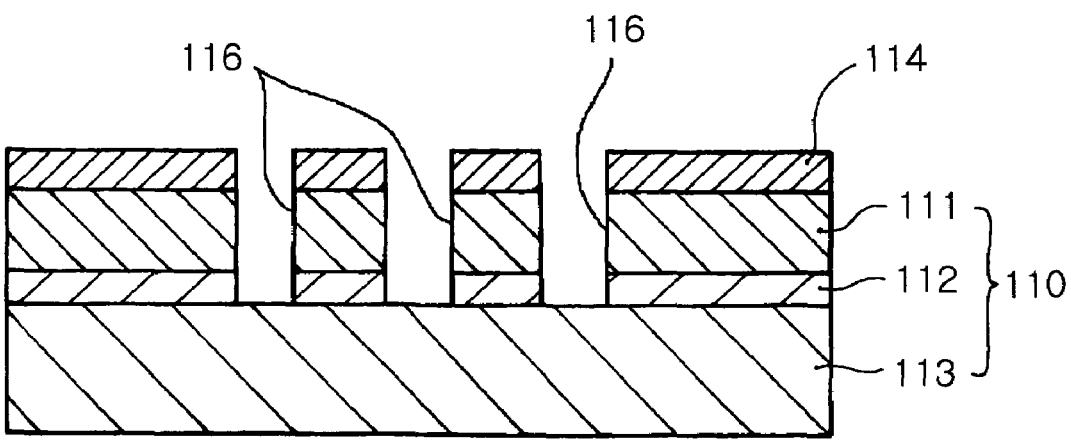

That is, as shown in FIG. 3c, the wafer substrate 110 in the reaction chamber 200 is treated such that the region having the photoresist mask 114 formed thereon is not etched, and only the region of the upper silicon layer 111 on which the photoresist mask 114 was not formed is first dry etched due to accelerating force and chemical action of ions.

In this case, on the upper silicon layer 111 of the wafer substrate 110 are formed a plurality of etched holes 116 which are anisotropically etched to the oxide film 112 in the vertical direction. The etched depth of the etched holes 116 is controlled by the oxide film 112 disposed between the upper silicon layer 111 and the lower silicon layer 113.

At this time, the etched holes 116 are formed only on the portion which will become the movable portion 100b, such as the beam or membrane, moving relative to the stationary portion 100a, while they are not formed on the stationary portion 100a.

Further, since the oxide film 112 is externally exposed at the bottom surface of the etched holes 116 formed by the first dry etching, the oxide film 112 externally exposed through the etched holes 116 reacts with a second etching gas in the reaction chamber 200 to which the CxFy-based second etching gas is supplied, to effect the second etching and removal of the oxide film.

As the CxFy-based second etching gas, there may be selectively used $C_2F_6$, $C_3F_8$, $C_4F_8$, $C_5F_8$, $CHF_3$, $CH_2F_2$, $CH_3F$ and the like.

Therefore, the second dry etching for removing the oxide film 112 and exposing the lower silicon layer 113 through the etched holes 116 is accomplished by the following reaction scheme:

$$Si + CxFy \rightarrow SiF_4(\uparrow) + C(\downarrow)$$ (Reaction scheme 1)

The F group of the second etching gas reacts with the Si component of the oxide film 112 to form $SiF_4$, thereby removing the oxide film 112. On the other hand, the C group is polymerized and accumulates to a predetermined thickness on the photoresist mask 114, and the upper and lower silicon layers 111 and 113, constituting the inner walls of the etched holes 116, thereby forming the protective layers 118.

At this time, during vapor depositing the polymer on the inner walls of the etched holes 116 to form the protective layers 118 while performing the second dry etching by reaction of the etching gas with the oxide film 112, the polymer is not vapor deposited on the upper surface of the lower silicon layer 113 corresponding to the bottom surface of the etched holes 116 and then the lower silicon layer 113 is exposed to the outside.

This is because the polymer vapor deposited on the bottom surface of the etched holes 116 was removed in the reaction chamber 200 by ion bombardment, the ions being vertically dropped through the etched holes 116 and impinged on the bottom surface of the etched holes 116.

Figure 3D:
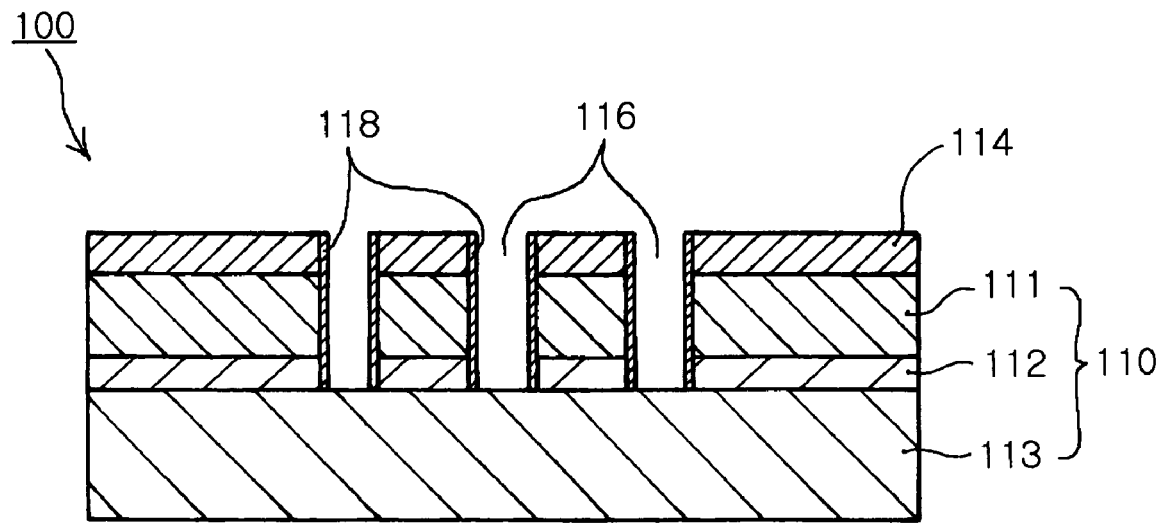

Therefore, the polymer vapor deposited in the etched holes 116 upon the second dry etching, as shown in FIG. 3d, was deposited only on the vertical side walls of the etched holes 116 to form the protective layers 118, while the protective layers 118 were not formed on the upper surface of the lower silicon layer 113 corresponding to the bottom surface of the etched holes 116.

As can be seen from FIG. 5, the ion bombardment is designed to pull cations or anions in plasma within the reaction chamber 200 downward and impinge the downwardly pulled ion components on the bottom surface of the etched holes 116 by selectively applying cathode or anode voltage via a power supply 120 to the wafer substrate 110 in the reaction chamber 200 in which the second dry etching is performed so that ions collide with the bottom surface of the etched holes 116 to generate physical impact.

Then, the movable portion 100b to be floated in the floating space R is protected by the photoresist mask 114 remaining on the upper surface of the upper silicon layer 111 and the polymer protective layers 118 remaining on the inner walls of the etched holes 116.

Meanwhile, in forming the polymer protective layers 118 while removing the oxide film 112 by dry etching reaction between the second etching gas and oxide film 112, when the polymer protective layers 118 vapor deposited on the inner walls of the etched holes 116 are excessively accumulated, the path of the etched holes 116 is blocked thus making it difficult for reaction between a third etching gas and the lower silicon layer 113 to take place, the third etching gas being supplied through the etched holes 116 upon the third dry etching.

Additionally, when step coverage of the polymer protective layers 118 accumulated in the etched holes 116 during the second dry etching is poor, relatively thick protective layers 118 are formed on the upper portions of the side walls of the etched holes 116, while relatively thin protective layers are formed on the lower part thereof. In this case, the lower part of the etched holes 116 is not properly protected by the polymer protective layers 118, thereby the upper silicon layer 111 to be protected from the etching gas in the third dry etching is etched away thus making the movable portion 100b brittle.

Further, if the polymer protective layers 118 are not dense enough, a function of protecting the inner walls of the etched holes 116 is lowered and then the upper silicon layer 111 is unnecessarily etched in the third dry etching, rendering the movable portion 100b brittle.

Therefore, upon second dry etching, by widely varying process conditions such as vacuum pressure of the inner space of the reaction chamber 200, a kind and mixing ratio of the etching gases used, intensity of plasma, etc., it is preferable to vapor deposit the polymer protective layers in uniform thickness while securing a path sufficient for exposing the lower silicon layer 113 upwardly through the lower surface of the etched holes 116.

Further, since the oxide film 112 at the bottom surface of the etched holes 116 is etched away by the second dry etching process and thus the lower silicon layer 113 is externally exposed through the etched holes 116, the lower silicon layer 113 externally exposed through the etched holes 116 protected by the polymer protective layers 118 reacts with the third etching gas in the reaction chamber 200 to which the third etching gas is supplied, to conduct the third dry etching. $XeF_2$, $SF_6$ and $CF_4$ may be selectively used as the third etching gas.

The third etching for removing the lower silicon layer 113 exposed through the etched holes 116 is accomplished by the following reaction scheme:

(Reaction scheme 2)

That is, the F group of the third etching gas reacts with the Si component of the lower silicon layer 113 to form $SiF_4$ thus performing isotropic etching.

Figure 3E:
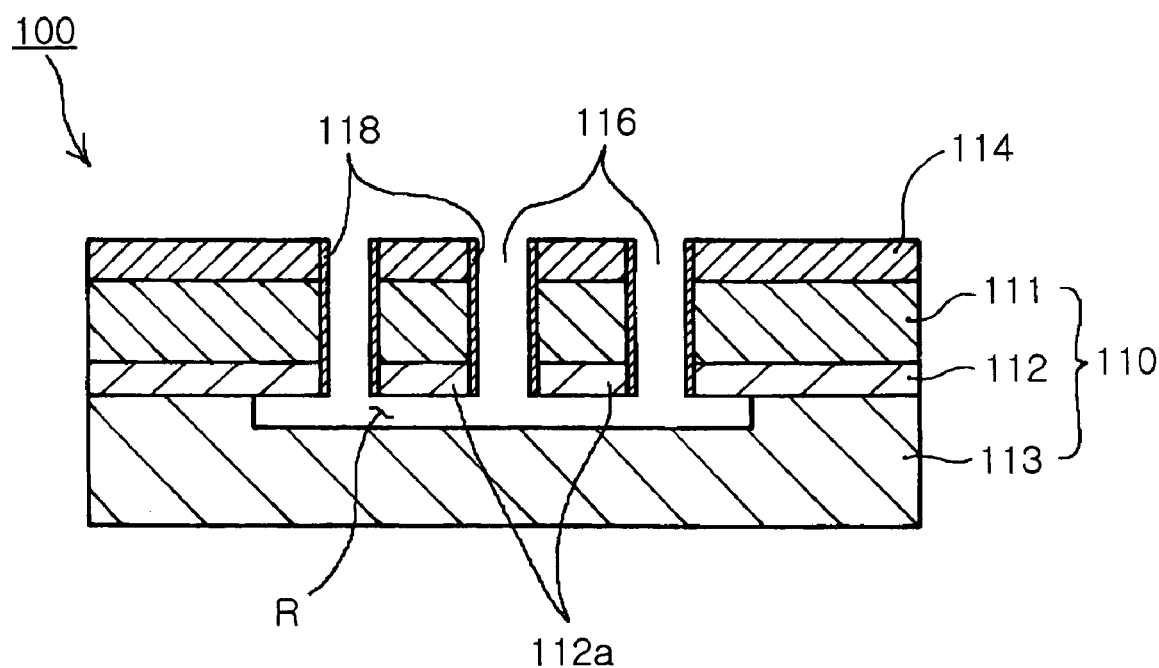

In this case, as shown in FIG. 3e, the lower silicon layer 113 constituting the wafer substrate 110 reacts with the third etching gas supplied through the etched holes 116 to perform isotropic etching to a predetermined depth thus forming the floating space R immediately below the etched holes 116.

Therefore, it is possible to have, in the floating space R, the movable portion 100b movable relative to the stationary portion 100a having no etched holes 116 formed thereon.

Subsequently, when formation of the floating space R for floating the movable portion 100b by isotropically etching the lower silicon layer 113 using the third dry etching process is completed, reaction activation force of $O_2$ supplied from an $O_2$ Plasma Asher (not shown) is used to burn and remove the photoresist mask 114 of organic material and the polymer protective layers 118 in vapor phase.

Figure 3F:
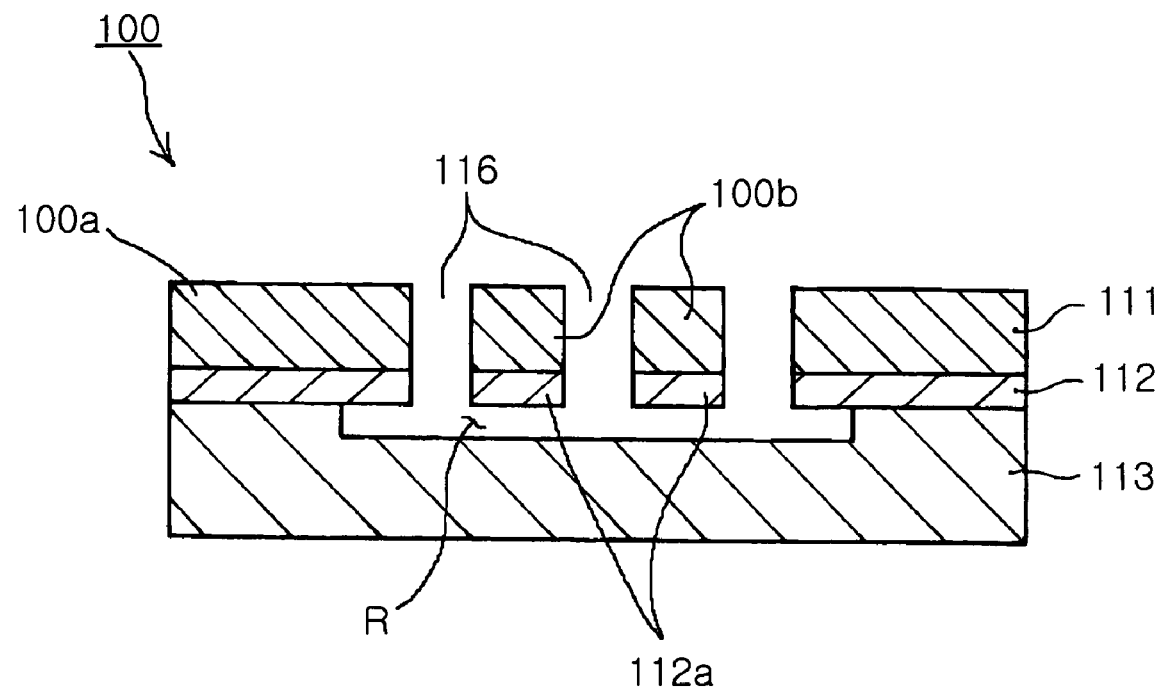

As shown in FIG. 3f, by removing the photoresist mask 114 remaining on the upper surface of the wafer substrate 110 and the polymer protective layers 118 formed on the etched holes 116 using the $O_2$ Plasma Asher, it is possible to perfectly construct the free-moving movable portion 100b relative to the stationary portion 100a integrally connected with the wafer substrate 110. In this connection, an ashing process of removing the photoresist mask 114 remaining after forming the floating space R, and the polymer protective layers 118 is performed in a separate reaction chamber other than the reaction chamber 200 in which the first, second and third dry etching processes are performed, respectively.

Since the first, second and third dry etching processes are conducted in the reaction chamber 200 having the same configuration, respectively, the process for fabrication of the MEMS structure is simplified and production time is reduced, thereby savings in production costs may be attained.

At this time, the floating space R which floats the movable portion 100b is formed by the dry etching process, not by wet etching using an etchant, and thus stiction phenomenon of the movable portion 100b by surface tension of the remaining solution occurring in dry process may be fundamentally prevented.

Meanwhile, the MEMS structure 100 fabricated by the first, second and third dry etching and ashing processes, as shown in FIG. 4, comprises the wafer substrate 110 having the upper and lower silicon layers 111 and 113 and the oxide film 112 disposed therebetween, the stationary portion 100a integrally connected with the wafer substrate 110, and the movable portion 100b movably suspended relative to the stationary portion 100a.

Then, on the lower silicon layer 113 of the wafer substrate 110 corresponding to the immediately lower part of the movable portion 100b, the floating space R having a predetermined depth for floating the movable portion 100b is formed by the third etching gas supplied through the etched holes 116 whose oxide film 112 of the bottom surface thereof was removed in the second dry etching process.

In this connection, the floating space R is isotropically etched to a minimum of the predetermined depth on the lower silicon layer 113 so as to control a minimum amount of upward and downward displacement such that the movable portion 100b having the upper and lower surfaces moves upwardly and downwardly.

Further, on the lower surface of the movable portion 100b corresponding to the lower silicon layer 113, the oxide film 112a for preventing electrical short circuit remains so as to prevent electrical contact between the movable portion 100b and the lower silicon layer 113, to which electric currents with opposite polarities are applied, the floating space R being positioned therebetween.

In this case, the oxide film 112a is preferably formed to a thickness of 500 Å to 2 μm so as to electrically insulate the space between the upper and lower silicon layers 111 and 113, to which electric currents with opposite polarities are applied. This is because where the oxide film 112a is vapor deposited to a thickness of below 500 Å, insulation between the silicon layers is lowered, while above the thickness of 2 μm, the vapor deposition and etching of the oxide film become inordinately expensive.

As apparent from the above description, in accordance with the present invention, by forming the floating space for floating the movable portion using only the dry etching process without an etchant, it is possible to prevent stiction caused in drying of the remaining etchant in the floating space, thus ensuring stable floatation of the movable portion leading to improvement of sensor sensitivity and production yield.

In addition, by forming the oxide film for preventing electrical short circuit so as to be remained on the lower surface of the movable portion, it is possible to preemptively prevent electrical short circuit even when there is unavoidable contact between the wafer substrate and the movable portion to which electrical current with opposite polarities are applied.

Further, it is possible to reduce the thickness of the oxide film disposed between the upper and lower silicon layers to the minimum range, and thus there can be obtained effects such as reduction of the amount of the expensive oxide film used, thus reducing production costs, and simplification of the production process by performing the first, second and third etching in the same reaction chamber.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a MEMS structure having a movable portion movable relative to a stationary portion, comprising the steps of:
   providing a wafer substrate having an oxide film disposed between upper and lower silicon layers thereof;
   patterning a photoresist mask on the upper surface of the wafer substrate;
   first dry etching the wafer substrate by using a first dry etching gas to expose the oxide film so as to form a plurality of etched holes on the upper silicon layer;
   removing the oxide film externally exposed at the bottom surface of the etched holes by a second dry etching using a second dry etching gas while vapor depositing polymer protective layers on the inner circumferences of the etched holes;
   forming a floating space in which floatable movement of the movable portion is permitted, by third dry etching the lower silicon layer exposed through the bottom surface of the etched holes from which the oxide film was removed, using a third dry etching gas; and
   removing the photoresist mask remaining on the upper surface of the wafer substrate and the polymer protective layers vapor deposited on the etched holes.

2. The method as set forth in claim 1, wherein the second dry etching step of removing the oxide film externally exposed through the etched holes is performed by reaction of the second etching gas and oxide film in a reaction chamber to which the CxFy-based second etching gas is supplied.

3. The method as set forth in claim 1, wherein in the step of forming the protective layers by vapor depositing the polymer on the inner walls of the etched holes, the polymer is not vapor deposited on the bottom surface of the etched holes due to ion bombardment of ions impinging on the bottom surface of the etched holes and thus the lower silicon layer is externally exposed.

4. The method as set forth in claim 3, wherein the ion bombardment is performed by selectively applying cathode or anode voltage to the wafer substrate in the reaction chamber such that cations or anions in the reaction chamber are physically impinged on the bottom surface of the etched holes.

5. The method as set forth in claim 1, wherein the third dry etching step of removing the lower silicon layer through the etched holes is performed by reaction of the third etching gas and the lower silicon layer in the reaction chamber to which the third etching gas such as $XeF_2$, $SF_6$, or $CF_4$ is supplied.

6. The method as set forth in claim 1, wherein the first dry etching for dry etching the etched holes, the second dry etching for removing the oxide film and the third dry etching for dry etching the lower silicon layer are performed in the same reaction chamber.

* * * * *